(12) United States Patent  
Shumarayev et al.

(10) Patent No.: US 7,525,340 B2
(45) Date of Patent: Apr. 28, 2009

(54) PROGRAMMABLE LOGIC DEVICE ARCHITECTURE FOR ACCOMMODATING SPECIALIZED CIRCUITRY

(75) Inventors: Sergey Y Shumarayev, San Leandro, CA (US); Rakesh H Patel, Cupertino, CA (US); Chong H Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 102 days.

(21) Appl. No.: 11/230,002

(22) Filed: Sep. 19, 2005

(65) Prior Publication Data

US 2007/0063733 A1    Mar. 22, 2007

(51) Int. Cl.
G09F 7/38      (2006.01)
H03K 19/173    (2006.01)
H03K 19/177    (2006.01)
H01L 25/00     (2006.01)

(52) U.S. Cl. .............................. 326/37; 326/38; 326/39; 326/40; 326/41

(58) Field of Classification Search ............. 326/37–50, 326/62–92, 101–103; 710/305–306; 370/359, 370/419, 208–210; 711/154
See application file for complete search history.

(56) References Cited

U.S. PATENT DOCUMENTS 6,229,378 B1 *   5/2001   Gourley et al. ............... 327/525
6,920,528 B1 *   7/2005   Chan .......................... 711/115
7,020,728 B1 *   3/2006   Jones et al. .................. 710/305
7,320,100 B2 *   1/2008   Dixon et al. ................. 714/758
2003/0206036 A1 * 11/2003  Or-Bach ....................... 326/41

* cited by examiner

Primary Examiner—Rexford Barnie
Assistant Examiner—Matthew C Tabler
(74) Attorney, Agent, or Firm—Ropes & Gray LLP; Jeffrey H. Ingerman

(57) ABSTRACT

A programmable logic device (PLD) having one or more programmable logic regions and one or more conventional input/output regions additionally has one or more peripheral areas including specialized circuitry. The peripheral specialized regions, which are not connected to the remainder of the programmable logic device (and may be made on separate dies from the remainder of the programmable logic device mounted on a common substrate), and one or both of the programmable logic regions and the conventional I/O regions, have contacts for metallization traces or other interconnections to connect the peripheral specialized regions to the remainder of the programmable logic device. The same PLD can be sold with or without the specialized circuitry capability by providing or not providing the interconnections. The peripheral specialized regions may include high-speed I/O (basic, up to about 3 Gbps, and enhanced, up to about 10-12 Gbps), as well as other types of specialized circuitry.

16 Claims, 4 Drawing Sheets

PROGRAMMABLE LOGIC DEVICE ARCHITECTURE FOR ACCOMMODATING SPECIALIZED CIRCUITRY

BACKGROUND OF THE INVENTION

This invention relates to a programmable logic device (PLD) architecture for accommodating specialized circuitry, such as a high-speed serial interface. More particularly, this invention relates to a programmable logic device architecture that allows the same die design to be used for different models within a family of PLDs, where the different models may or may not have specialized circuitry or such specialized circuitry may differ.

It has become common for PLDs to incorporate high-speed serial interfaces to accommodate high-speed (i.e., greater than 1 Gbps) serial I/O standards—e.g., the XAUI (Extended Attachment Unit Interface) standard and other standards. However, not all users of programmable logic devices require a high-speed serial interface, even among users having otherwise identical requirements for programmable logic functionality. Moreover, even among users who require a high-speed serial interface, some users may have enhanced requirements for such an interface, including, e.g., wider data rate support or more channels. Up to now, such a family of programmable logic devices would have at least three different members (even more when the availability of models of different size is considered), developed as different integrated circuit dies, increasing both cost and development times.

Other types of specialized circuitry, sometimes know as "hard logic" or "IP" blocks, are also provided on programmable logic devices, such as multipliers, digital signal processing blocks, phase-locked loops and delay-locked loops, etc. Similar considerations apply to those other types of specialized circuitry as well—i.e., different models of the same family may provide different capabilities with respect to one or more of those other types of specialized circuitry.

It would be desirable to be able to provide a family of programmable logic devices with different levels of support for specialized circuitry—from no support through enhanced support—with reduced development cost and times.

SUMMARY OF THE INVENTION

The present invention provides a programmable logic device architecture in which specialized circuitry regions are provided on the periphery of the device. The remainder of the device could be arranged in a known configuration. For example, in one embodiment the programmable logic regions can be located in the core of the device, with more conventional input/output (I/O) regions located around the periphery of the core, just inside the peripheral specialized circuitry regions. The core logic regions could also contain hard logic regions that are not to be placed in the peripheral specialized circuitry regions—e.g., hard logic that will be the same for all devices in the family. In another embodiment, the more conventional I/O regions could be scattered throughout the device—e.g., in bands separating regions of soft or hard logic.

Contacts can be provided on the peripheral specialized circuitry regions and on one or both of the logic regions and the more conventional I/O regions, for accepting metallization traces or other interconnections (such as wirebonds) to connect the specialized circuitry regions to the remainder of the device. The integrated circuit die for all family members of a given size could be made with the specialized circuitry regions, but device could be sold as different devices, both with and without the metallization traces to connect the specialized circuitry regions to the remainder of the device. In the case where the specialized circuitry regions are high-speed serial interface regions and both ordinary and enhanced high-speed serial interface regions are provided, the device could be sold with both types of high-speed serial interface region connected, or with only one type of high-speed serial interface region connected. In any case, only one integrated circuit die would have to be developed and tested.

Thus, in accordance with the present invention there is provided a programmable logic device including a peripheral area having therewithin at least one specialized circuitry region. At least one region of programmable logic is distributed in a region bounded by that peripheral region. At least one input/output region is distributed in the region bounded by the peripheral region for providing input/output function other than specialized circuitry function. Each of the at least one specialized circuitry region, and at least one of (a) the at least one region of programmable logic and (b) the at least one input/output region, has at least one contact for accepting an interconnection for connecting the at least one specialized circuitry region to at least one of (a) the at least one region of programmable logic and (b) the at least one input/output region. The at least one specialized circuitry region lacks connectivity to either of (a) the at least one region of programmable logic and (b) the at least one input/output region, other than through the at least one contact.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention provides a family of programmable logic devices with different levels of support for specialized circuitry, including high-speed serial interface regions and other types of specialized circuitry—from no support through enhanced support—with reduced development cost and times, by providing specialized circuitry regions on the periphery of the device, with the remainder of the device arranged in a known configuration. Contacts preferably are provided on the peripheral specialized circuitry regions and on one or both of the logic regions and the I/O regions, for accepting interconnections (e.g., metallization traces or wirebonds) to connect the specialized circuitry regions to the remainder of the device.

Preferably, the specialized circuitry regions are not otherwise connected to the other portions of the device. This allows the same die to be sold as different products by providing or not providing the interconnections to connect or not connect one or more of the specialized circuitry regions to the other portions of the device.

For convenience and ease of description, the invention may be described hereinafter in terms of high-speed serial interface regions, but it should be understood that any type of specialized circuitry region is intended.

The invention will now be described with reference to FIGS. 1-6.

Figure 1:
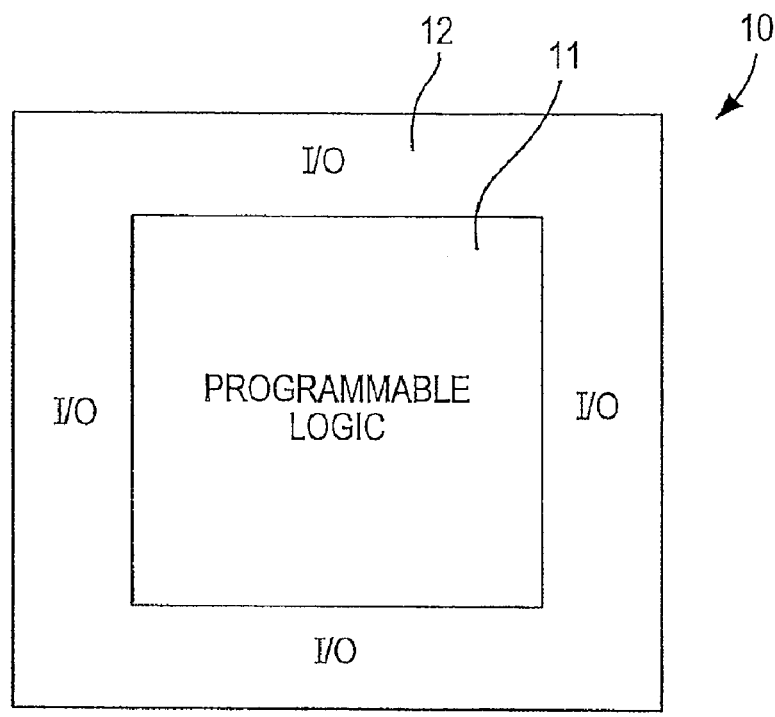
FIG. 1 is a schematic representation of one embodiment of a previously known programmable logic device.
Figure 2:
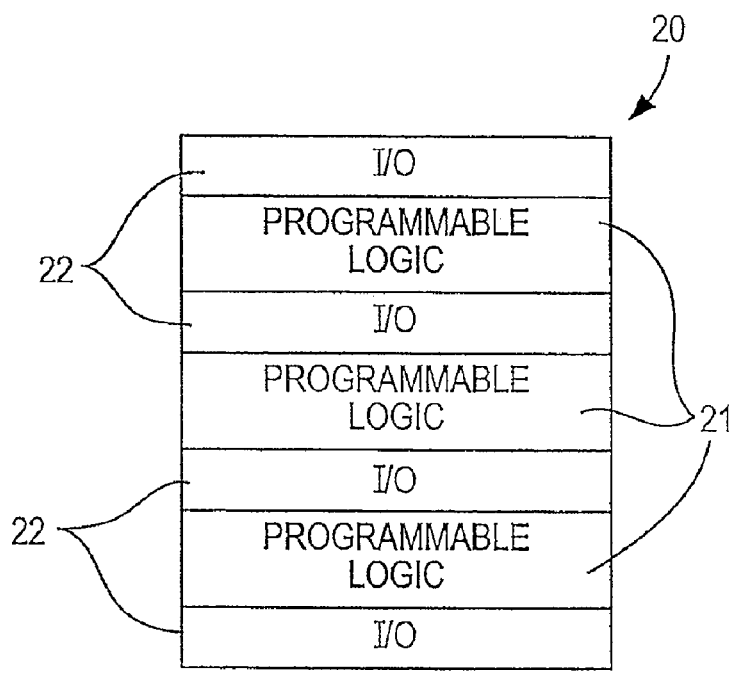
FIG. 2 is a schematic representation of a second embodiment of a previously known programmable logic device.

PLD 10, shown schematically in FIG. 1, is one example of a device of which the present invention is an improvement. PLD 10 has a central area or core 11 of programmable logic, and a peripheral area 12 where the various I/O interfaces reside. This arrangement allows for easy connection between the I/O interfaces and the physical I/O pins of the package (not shown) in which PLD 10 is packaged. Alternatively, as shown in FIG. 2, PLD 20, of which the present invention also is an improvement, includes I/O regions 22 interspersed among programmable logic regions 21. This arrangement allows easier connection of individual input/output logic signals to respective I/O interfaces, with potential improvements in timing and/or skew and reduced buffering requirements.

With both PLD 10 or PLD 20, the conventional way to add high-speed serial interfaces was to redesign I/O regions 12, 22 to include them. This meant that I/O regions 12, 22 would be different as between two otherwise identical versions of a PLD 10, 20 that either lacked or included a high-speed serial interface. Moreover, to accommodate high-speed serial interfaces in regions 12, 22, either regions 12, 22 would have to be made larger at the expense of programmable logic regions 11, 21, or the conventional I/O capabilities of the device would have to be reduced. Either way, as between a variant of device 10, 20 without a high-speed serial interface and a variant of device 10, 20 with a high-speed serial interface, the design and engineering of the variants had to be different. If enhanced high-speed serial interface also had to be provided as an option, that would introduce yet a third variant, and a fourth if only the enhanced variety were provided. Moreover, there was no way to know, simply because one variant functioned as designed, that the other variant would function as designed. The different variants had to be separately tested.

The present invention preferably does away with the aforementioned variants. Instead, for a given size of programmable logic device, with or without high-speed serial interface capability, a single die can be designed and tested that incorporates programmable logic regions and conventional I/O regions. The high-speed serial interfaces are provided in a separate region, preferably around the periphery of the die.

These separate high-speed serial interface regions preferably are not connected to the remainder of the device through the general interconnect structure of the device. Instead, both the high-speed serial interface regions and one or both of the programmable logic region(s) and the conventional I/O region(s) preferably are provided with contacts that can be interconnected by separate interconnections. Accordingly, the one device can be sold as at least three different devices depending on what interconnections are provided. Specifically, the device can be sold with no high-speed serial interface enabled, with only the basic high-speed serial interface enabled, or with both basic and extended high-speed serial interfaces enabled. As a fourth possibility, only the extended high-speed serial interface could be enabled. For all of these possibilities, only one device needs to be designed, engineered and tested.

Figure 3:
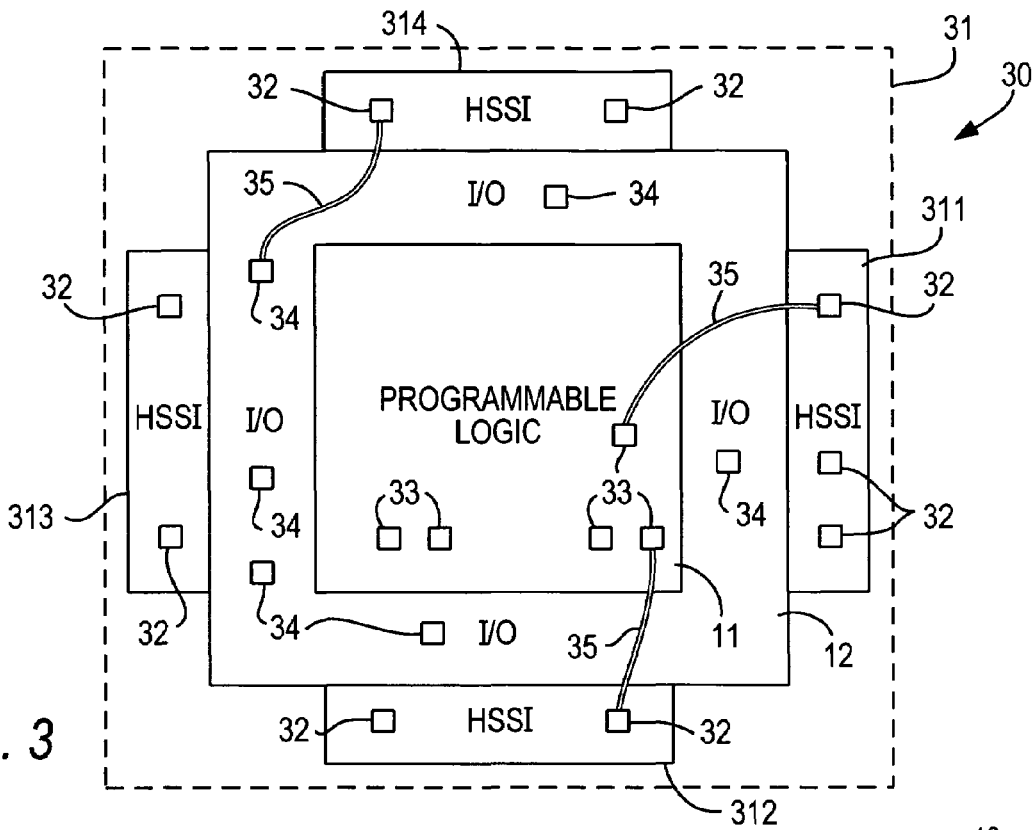
FIG. 3 is a schematic representation of one embodiment of a programmable logic device according to the present invention, based on the previously known device of FIG. 1.

FIG. 3 shows a first embodiment 30 according to the invention, based on previously known device 10. Thus device 30, like device 10, has a central programmable logic region 11 surrounded by conventional I/O region 12, which may include, as is well known, different types of I/O interfaces which preferably are programmably selectable. In device 30, regions 11 and 12 preferably are surrounded by peripheral ring 31 where high-speed serial interfaces are placed. Although the high-speed serial interfaces may be placed throughout peripheral ring 31, they may also be placed in only some, or one, of portions 311, 312, 313, 314 of peripheral ring 31. In order to connect the high-speed serial interfaces of ring 31 to the remainder of device 30, contacts 32 preferably are provided on the surface of ring 31, and contacts 33, 34 preferably are provided on the surface of one or both of programmable logic region 11 and conventional I/O region 12.

Device 30 can be sold with no high-speed serial interface capability by not providing any connection between contacts 32 and the remainder of device 30. When it is desired to sell device 30 as a device with high-speed serial interface capability, metallization traces 35 preferably are provided between contacts 32 and contacts 33 and/or 34. While connecting the high-speed interfaces directly to programmable logic region 11 via contacts 33 may reduce delays and skew caused by capacitive loading (as compared to connecting the high-speed interfaces to programmable logic through the conventional interfaces), doing so also consumes greater device area because those interconnections have to be provided for even if they are not used. On the other hand, connecting the high-speed interfaces directly to programmable logic region 11 through conventional I/O region 12 via contacts 34 may introduce the aforementioned delays and skew. The trade-offs should be weighed in any particular design.

Figure 4:
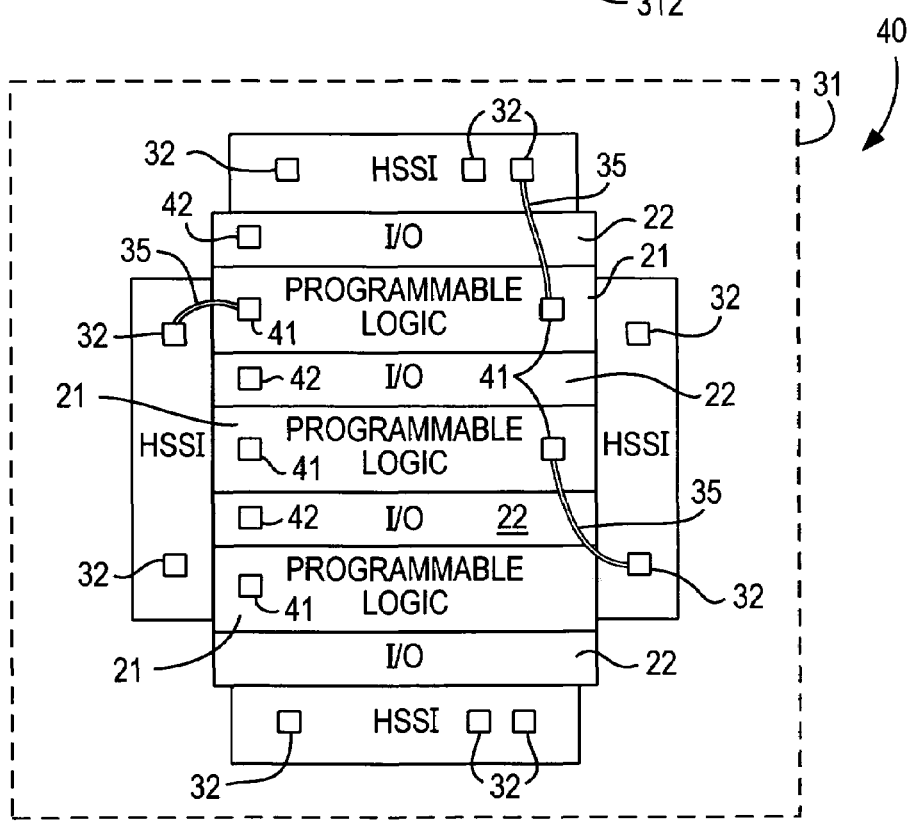
FIG. 4 is a schematic representation of another embodiment of a programmable logic device according to the present invention, based on the previously known device of FIG. 2.

FIG. 4 shows a second embodiment 40 according to the invention, based on previously known device 20. Thus device 40, like device 20, has I/O regions 22 interspersed among programmable logic regions 21. Like device 30, device 40 also has peripheral ring 31 where high-speed serial interfaces are placed. Although the high-speed serial interfaces may be placed throughout peripheral ring 31, they may also be placed in only some, or one, of portions 311, 312, 313, 314 of peripheral ring 31. In order to connect the high-speed serial interfaces of ring 31 to the remainder of device 40, contacts 32 preferably are provided on the surface of ring 30, and contacts 43, 44 preferably are provided on the surface of one or both of programmable logic regions 21 and conventional I/O regions 22.

Device 40 can be sold with no high-speed serial interface capability by not providing any connection between contacts 32 and the remainder of device 40. When it is desired to sell device 40 as a device with high-speed serial interface capability, metallization traces 35 preferably are provided between contacts 42 and contacts 43 and/or 44, as in the case of device 30, and based on the same considerations.

Figure 5:
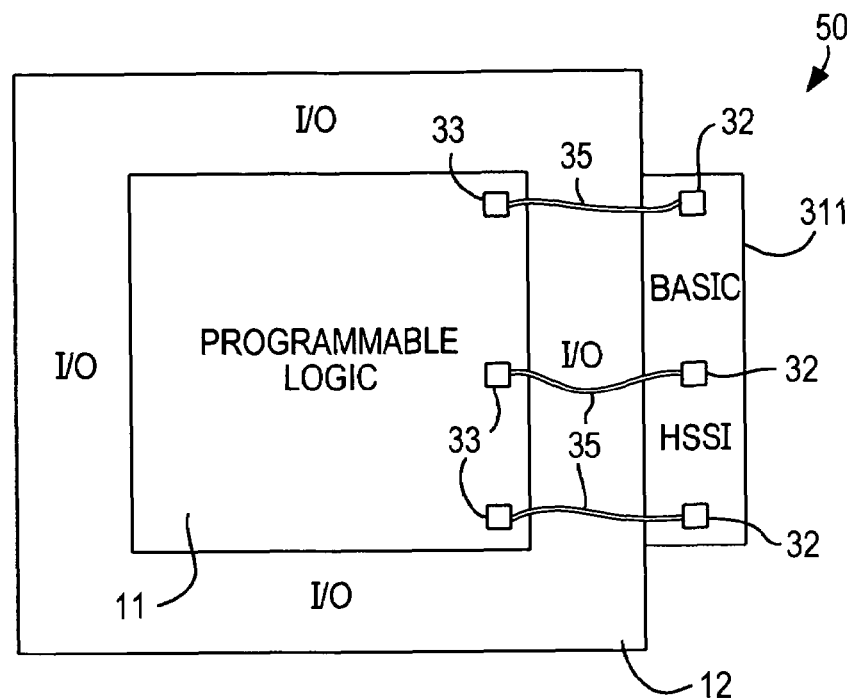
FIG. 5 is a schematic representation of yet another embodiment of a programmable logic device according to the present invention, based on the previously known device of FIG. 1.
Figure 6:
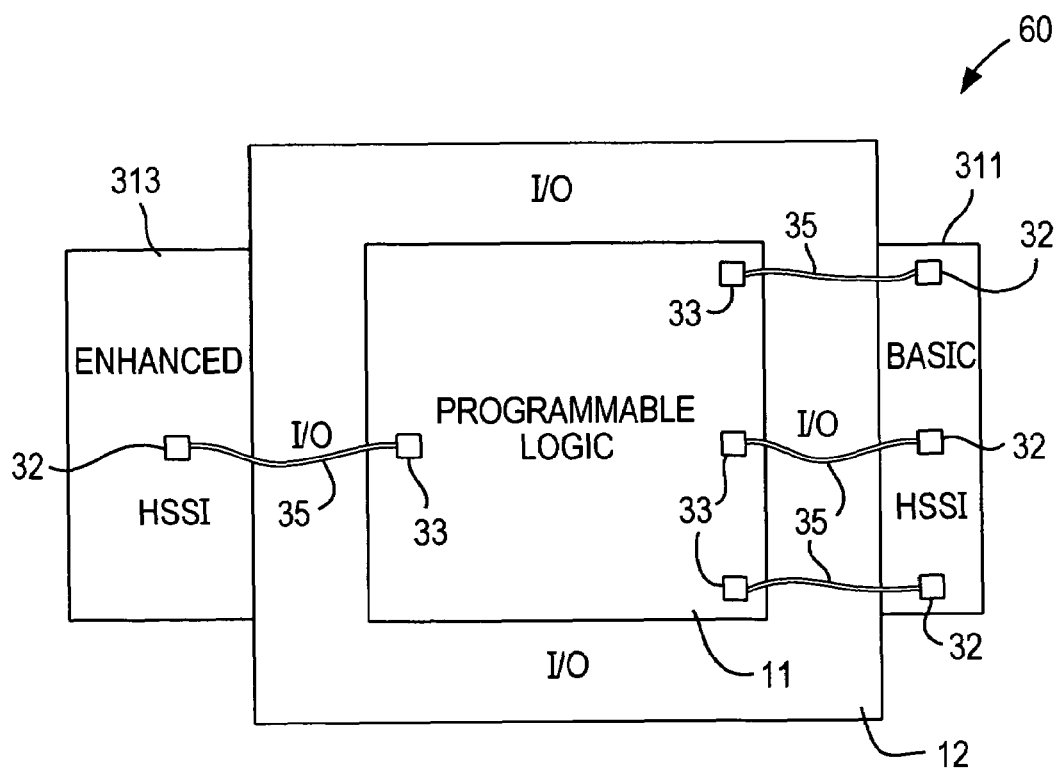
FIG. 6 is a schematic representation of still another embodiment of a programmable logic device according to the present invention, based on the previously known device of FIG. 1.

Additional variations 50, 60 of device 30 are shown in FIGS. 5 and 6. As described above, not all regions 311-314 of peripheral ring 31 need have high-speed serial interface circuitry. Variation 50 of FIG. 5 shows explicitly how high-speed serial interface circuitry may be provided only in region 311. In this case, the circuitry in region 311 is basic high-speed serial interface circuitry. Variation 60 of FIG. 6 shows explicitly how high-speed serial interface circuitry may be provided only in regions 311, 313. In this case, the circuitry in region 311 is basic high-speed serial interface circuitry capable of data rates up to about 3 Gbps, while the circuitry in region 313 is enhanced high-speed serial interface circuitry capable of data rates up to about 10-12 Gbps. Similar variations (not shown) of device 40 also may be provided.

It will be appreciated that although the high-speed serial interface circuitry is shown as being connected to the remainder of device 30/40/50/60 by metallization traces 35, other types of interconnection, such as wirebonding, may also be used. Moreover, because peripheral ring 31 is not otherwise connected device 30/40/50/60, the components of peripheral ring 31 may be made on one or more separate dies that are mounted on a common substrate with regions 11, 12 or 21, 22. It also will be appreciated that the representations, number and placement of contacts 32, 33, 34, 43 and 44 and interconnections 35 in the drawings is purely schematic and exemplary. Finally, as discussed above, other types of specialized circuitry may be provided in the peripheral regions.

Figure 7:
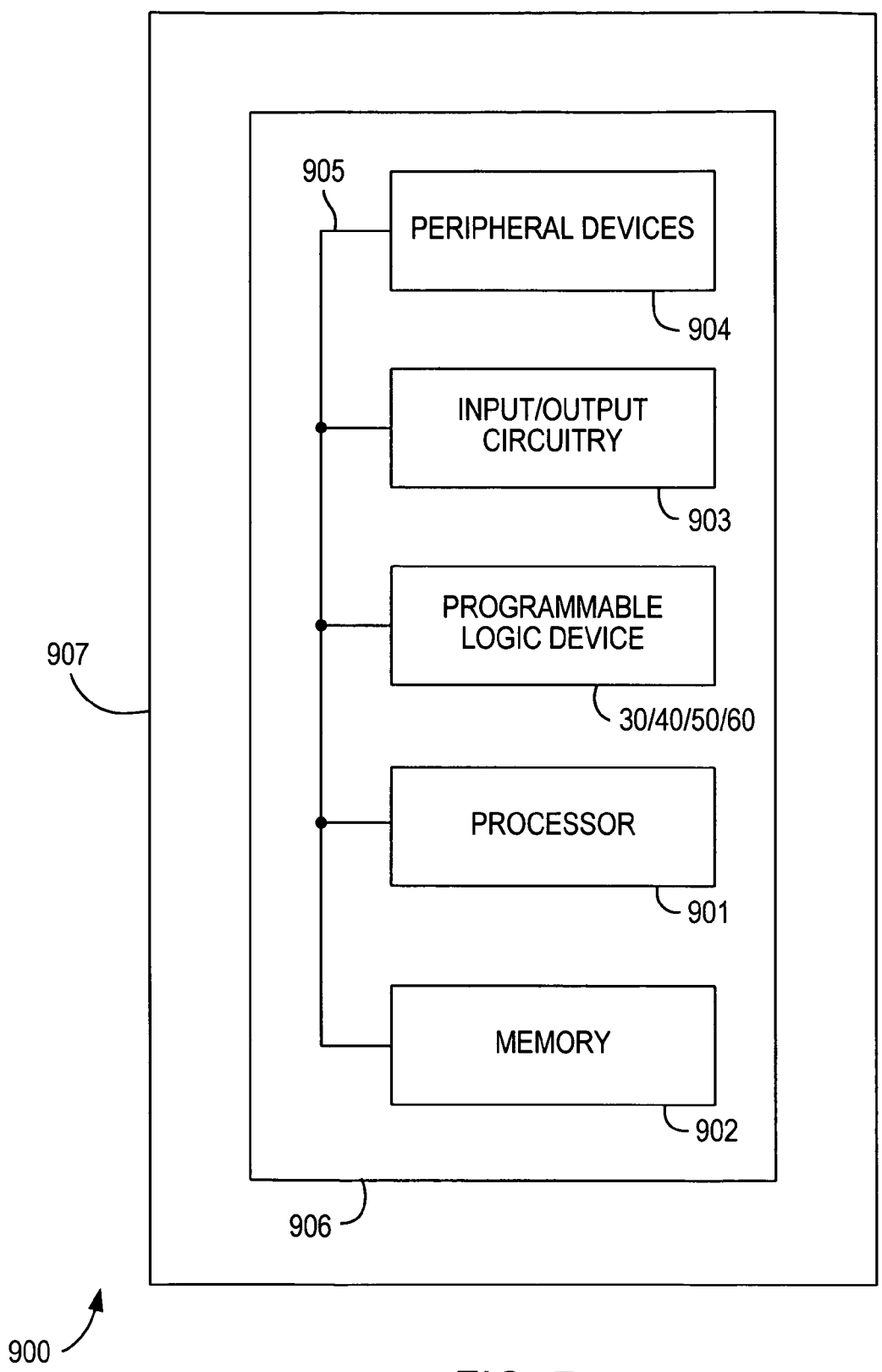
FIG. 7 is a simplified block diagram of an illustrative system employing a programmable logic device in accordance with the present invention.

A PLD 30/40/50/60 according to the present invention may be used in many kinds of electronic devices. One possible use is in a data processing system 900 shown in FIG. 7. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 30/40/50/60 can be used to perform a variety of different logic functions. For example, PLD 30/40/50/60 can be configured as a processor or controller that works in cooperation with processor 901. PLD 30/40/50/60 may also be used as an arbiter for arbitrating access to a shared resources in system 900. In yet another example, PLD 30/40/50/60 can be configured as an interface between processor 901 and one of the other components in system 900. It should be noted that system 900 is only exemplary, and that the true scope and spirit of the invention should be indicated by the following claims.

Various technologies can be used to implement PLDs 30/40/50/60 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A programmable logic device comprising a single die and having, on said single die:
   at least one region of programmable logic;
   at least one input/output region in electrically conductive relationship with said at least one region of programmable logic for providing input/output functions to said at least one region of programmable logic; and
   at least one specialized circuitry region distributed in a peripheral area of said single die surrounding said at least one region of programmable logic and said at least one input/output region, each of said at least one specialized circuitry region comprising at least one of a plurality of types of high-speed serial interface circuitry; wherein:
   each said specialized circuitry region is electrically isolated from each other said specialized circuitry region, from said at least one region of programmable logic, and from said at least one input/output region; and
   each of said at least one of a plurality of types of high-speed serial interface circuitry in said at least one specialized circuitry region, and at least one of (a) said at least one region of programmable logic and (b) said at least one input/output region, has at least one contact for accepting an interconnection for connecting, externally of said die, said at least one of a plurality of types of high-speed serial interface circuitry to at least one of (a) said at least one region of programmable logic and (b) said at least one input/output region; said programmable logic device further comprising:
   at least one said external interconnection between a contact on one of said types of high-speed serial interface circuitry and one of (a) said at least one region of programmable logic and (b) said at least one input/output region, to form one of a plurality of programmable logic device products according to placement of said external interconnection.

2. The programmable logic device of claim 1 wherein said external interconnection comprises at least one metallization trace.

3. The programmable logic device of claim 1 further comprising at least one respective said external interconnection between a respective contact on each of said types of high-speed serial interface circuitry and a respective one of (a) said at least one region of programmable logic and (b) said at least one input/output region.

4. A digital processing system comprising:
   processing circuitry;
   a memory coupled to said processing circuitry; and
   a programmable logic device as defined in claim 1 coupled to the processing circuitry and the memory.

5. A printed circuit board on which is mounted a programmable logic device as defined in claim 1.

6. The printed circuit board defined in claim 5 further comprising:
   memory circuitry mounted on the printed circuit board and coupled to the programmable logic device.

7. The printed circuit board defined in claim 6 further comprising:
   processing circuitry mounted on the printed circuit board and coupled to the memory circuitry.

8. An integrated circuit comprising a single die and having, on said single die:
   at least one first circuitry region;
   at least one second circuitry region in electrically conductive relationship with said at least one first circuitry region for providing input/output functions to said at least one first circuitry region; and
   at least one third circuitry region distributed in a peripheral area of said single die surrounding said at least one first circuitry region and said at least one second circuitry region, each of said at least one third circuitry region comprising at least one of a plurality of types of high-speed serial interface circuitry; wherein:
   each said third circuitry region is electrically isolated from each other said third circuitry region, from said at least one first circuitry region, and from said at least one second circuitry region; and
   each of said at least one third circuitry region, and at least one of (a) said at least one first circuitry region and (b) said at least one second circuitry region, has at least one contact for accepting an interconnection for connecting, externally of said die, said at least one third circuitry region to at least one of (a) said at least one first circuitry region and (b) said at least one second circuitry region; said integrated circuit device further comprising:

at least one said external interconnection between a contact on one of said types of high-speed serial interface circuitry and one of (a) said at least one first circuitry region and (b) said at least one second circuitry region, to form one of a plurality of integrated circuit products according to placement of said external interconnection.

9. The integrated circuit of claim 8 wherein said external interconnection comprises at least one metallization trace.

10. The integrated circuit of claim 8 wherein said at least one first circuitry region comprises at least one region of programmable logic.

11. The integrated circuit of claim 1 further comprising at least one respective said external interconnection between a respective contact on each of said types of high-speed serial interface circuitry and a respective one of (a) said at least one first circuitry region and (b) said at least one second circuitry region.

12. A digital processing system comprising:
processing circuitry;
a memory coupled to said processing circuitry; and
an integrated circuit as defined in claim 8 coupled to the processing circuitry and the memory.

13. A printed circuit board on which is mounted an integrated circuit as defined in claim 8.

14. The printed circuit board defined in claim 13 further comprising:
memory circuitry mounted on the printed circuit board and coupled to the integrated circuit.

15. The printed circuit board defined in claim 14 further comprising:
processing circuitry mounted on the printed circuit board and coupled to the memory circuitry.

16. A method of manufacturing a family of integrated circuit device products, said method comprising:
forming an integrated circuit device comprising a single die and having, on said single die:
at least one first circuitry region,
at least one second circuitry region in electrically conductive relationship with said at least one first circuitry region for providing input/output functions to said at least one first circuitry region, and
at least one third circuitry region distributed in a peripheral area of said single die surrounding said at least one first circuitry region and said at least one second circuitry region, wherein:
each said third circuitry region (a) comprises at least one of a plurality of types of high-speed serial interface circuitry, and (b) is electrically isolated from each other said third circuitry region, from said at least one first circuitry region, and from said at least one second circuitry region, and
each of said at least one third circuitry region, and at least one of (a) said at least one first circuitry region and (b) said at least one second circuitry region, has at least one external contact; and
applying to said external contacts an interconnection for connecting, externally of said die, said at least one third circuitry region to at least one of (a) said at least one first circuitry region and (b) said at least one second circuitry region, to form one of a plurality of programmable logic device products according to placement of said external interconnection.

* * * * *